(12) United States Patent
Lenart

(10) Patent No.: US 9,060,448 B2
(45) Date of Patent: Jun. 16, 2015

(54) VERTICAL AIRFLOW SEGREGATION PANEL AND BAFFLE

(75) Inventor: Christopher Allen Lenart, Fairfax, VA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 280 days.

(21) Appl. No.: 13/548,967

(22) Filed: Jul. 13, 2012

(65) Prior Publication Data
US 2014/0016266 A1 Jan. 16, 2014

(51) Int. Cl.
*H05K 7/20* (2006.01)
*H05K 7/18* (2006.01)

(52) U.S. Cl.
CPC ............ *H05K 7/20145* (2013.01); *H05K 7/183* (2013.01); *H05K 7/20727* (2013.01); *H05K 7/20745* (2013.01)

(58) Field of Classification Search
CPC ................. H05K 7/18–7/186; H05K 7/20145; H05K 7/20572; H05K 7/20745
USPC .................... 361/679.46, 679.5–679.51, 690; 16/365, 368–369, 388, 389
See application file for complete search history.

(56) References Cited

U.S. PATENT DOCUMENTS

| | | | | |
|---|---|---|---|---|
| 1,727,319 A * | 9/1929 | Wasmuth | | 16/389 |
| 2,339,515 A * | 1/1944 | Parcher | | 602/20 |
| 3,178,245 A * | 4/1965 | Morioka et al. | | 312/265.3 |
| 3,232,333 A * | 2/1966 | Dixon | | 160/183 |
| 3,439,377 A * | 4/1969 | Bucholz | | 16/389 |
| 3,591,247 A * | 7/1971 | Berry et al. | | 312/304 |
| 3,629,900 A * | 12/1971 | Beerli, Jr. | | 16/349 |
| 3,744,085 A * | 7/1973 | Griego | | 16/325 |
| 3,745,997 A * | 7/1973 | Gledhill | | 602/12 |
| 4,758,925 A * | 7/1988 | Obata et al. | | 361/695 |
| 5,472,037 A * | 12/1995 | Hoffman | | 160/183 |
| 6,717,807 B2 * | 4/2004 | Hikawa | | 361/690 |
| 6,974,037 B2 * | 12/2005 | Haney | | 211/26 |
| 7,085,133 B2 * | 8/2006 | Hall | | 361/695 |
| 7,170,745 B2 * | 1/2007 | Bash et al. | | 361/695 |
| 7,595,985 B2 * | 9/2009 | Adducci et al. | | 361/695 |
| 7,855,885 B2 * | 12/2010 | Adducci et al. | | 361/692 |
| 7,983,038 B2 * | 7/2011 | Levesque et al. | | 361/692 |
| 8,035,965 B2 * | 10/2011 | Adducci et al. | | 361/692 |
| 8,113,012 B2 * | 2/2012 | Hoeft et al. | | 62/407 |
| 8,130,494 B2 * | 3/2012 | Larsen et al. | | 361/690 |
| 8,359,709 B2 * | 1/2013 | Van Gennep | | 16/328 |
| 8,363,998 B2 * | 1/2013 | Newman et al. | | 385/135 |
| 8,526,181 B2 * | 9/2013 | Levesque et al. | | 361/690 |
| 8,605,435 B1 * | 12/2013 | Ashby | | 361/695 |
| 8,804,333 B2 * | 8/2014 | Ashby | | 361/695 |
| 2009/0129000 A1 * | 5/2009 | Hoeft et al. | | 361/679.01 |
| 2009/0129014 A1 * | 5/2009 | Larsen et al. | | 361/692 |
| 2010/0290752 A1 * | 11/2010 | Newman et al. | | 385/135 |
| 2014/0206273 A1 * | 7/2014 | Larsen et al. | | 454/184 |
| 2014/0223946 A1 * | 8/2014 | Hall | | 62/259.2 |
| 2014/0370798 A1 * | 12/2014 | Larsen et al. | | 454/184 |

\* cited by examiner

*Primary Examiner* — Robert J Hoffberg

(57) ABSTRACT

An airflow segregation panel is disclosed for directing air flow. The airflow segregation panel includes a first connection end, an airflow direction portion and a hinge. The hinge is positioned between the first connection end and the air flow direction portion such that the air flow direction portion is selectively pivotable with respect to the first connection end. The airflow direction portion may be configured with a selectively adjustable length.

13 Claims, 4 Drawing Sheets

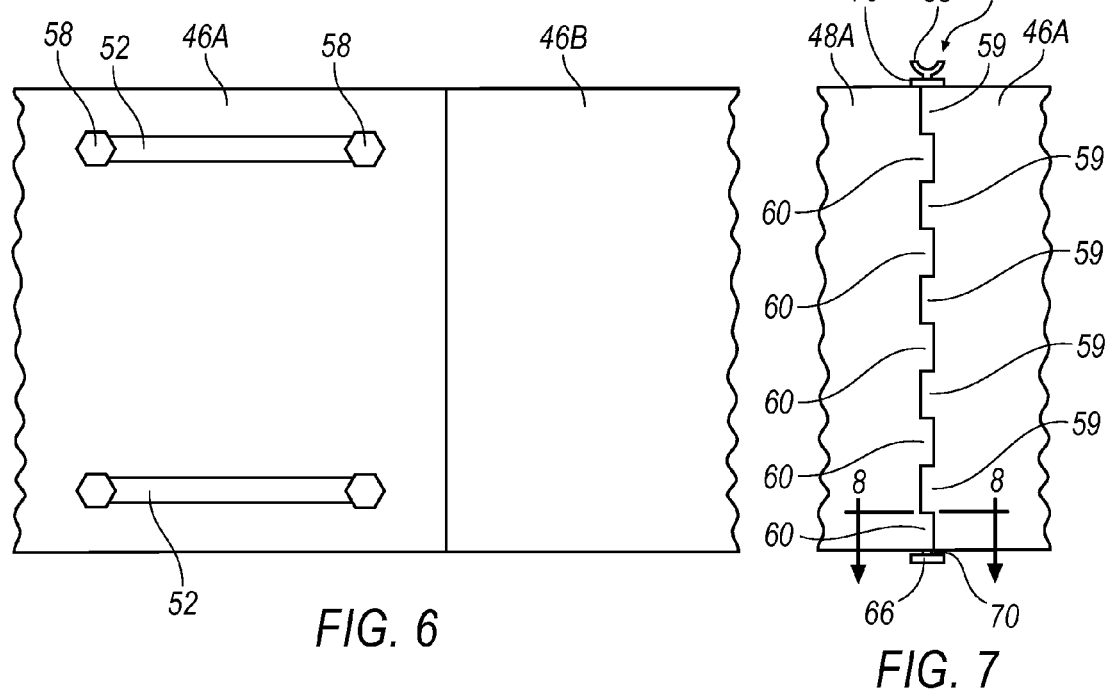
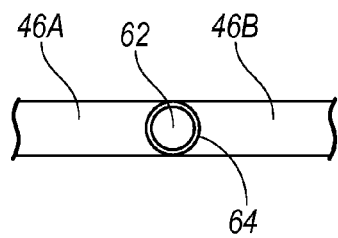

VERTICAL AIRFLOW SEGREGATION PANEL AND BAFFLE

BACKGROUND

Data centers are designed to include various electrical equipment/components that are stacked in various rack type housings. The racks are typically configured to circulate airflow in a front to back arrangement, with cool to hot airflow. However, in certain instances, the electrical equipment is configured to vent and cool using a side to side airflow. Thus, racks filled that are filled with side to side airflow cooling configured equipment in a front to back cooling data center configuration may cause heated air to become trapped in the racks, which can result in superheating of the surrounding air. This situation therefore may result in premature side to side airflow equipment failure, while further corrupting the airflow of adjacent equipment designed for front to back cooling.

Accordingly, as it is impractical to fill a specific rack with all of one type of equipment that requires either side to side cooling or front to back cooling, there is a need in the art of rack mounted equipment for a selectively adjustable airflow segregation panel that permits cool aisle air to be selectively directed with respect to an equipment rack, to allow adequate heat transfer of the surrounding air.

BRIEF DESCRIPTION OF THE DRAWINGS

Exemplary illustrations of the present disclosure are described in detail by referring to the drawings as follows.

FIG. 6 illustrates a side view of a portion of exemplary airflow segregation panel having adjustment slides with exemplary fasteners configured in the adjustment slides;

FIG. 7 illustrates a detailed side view of an exemplary hinge arrangement; and

FIG. 8 is a cross-sectional view of the hinge arrangement of FIG. 7.

DETAILED DESCRIPTION

Figure 1:
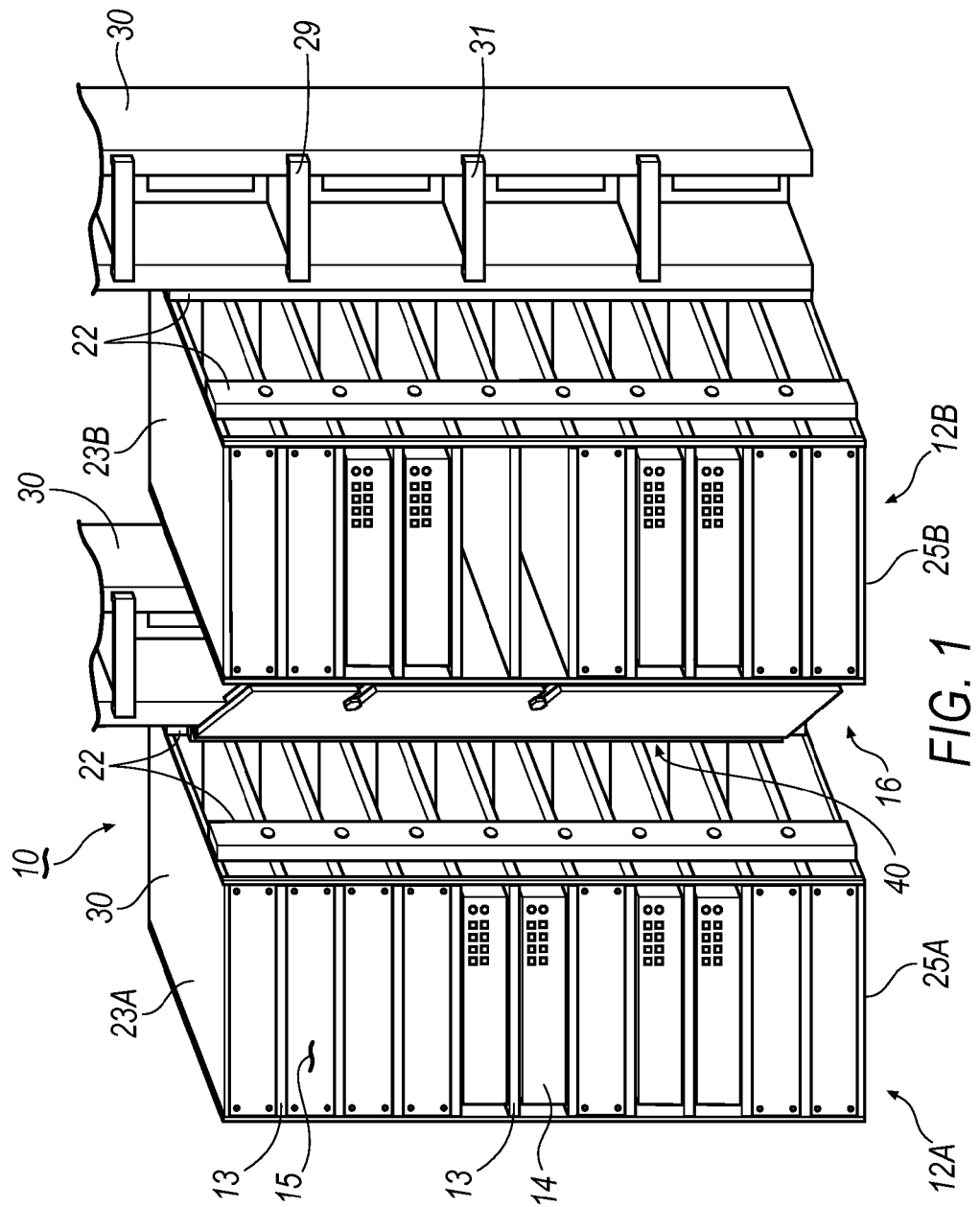
FIG. 1 illustrates an exemplary arrangement for an electronic equipment rack cooling system.

Referring now to the discussion that follows and also to the drawings, illustrative approaches to the disclosed apparatuses and methods are shown in detail. Although the drawings represent some possible approaches, the drawings are not necessarily to scale and certain features may be exaggerated, removed, or partially sectioned to better illustrate and explain the disclosed device. Further, the descriptions set forth herein are not intended to be exhaustive or otherwise limit or restrict the claims to the precise forms and configurations shown in the drawings and disclosed in the following detailed description.

A communications rack cooling segregation panel is disclosed. The segregation panel may be selectively adjustable longitudinally within a communications equipment rack. The segregation panel may be configured to direct airflow though a specific hot or cool aisle within the equipment rack. The segregation panel may be removably installed within the rack to selectively direct the airflow. When installed, the segregation panel may be positioned to extend vertically between a first rack having at least one side flow electrical equipment component and a second rack having at least one additional side flow electrical equipment component to direct a cool aisle air to flow through a communication rack. A vented cable riser or support may be configured between adjacent racks to permit cool air to flow between adjacent racks and into the side of side vented equipment. Hot air may be exhausted out of a side of the electrical equipment and then deflected by the segregation panel to a hot aisle exhaust path. The segregation panel may also work with front to back airflow equipment that may be configured adjacent to the side to side airflow equipment. Additionally, a plurality of segregation panels may be employed in successive racks of electrical equipment.

Each individual segregation panel may be configured to be extendable in a substantially horizontal direction by at least one sliding joint positioned between at least two overlapping panel segments to adjust the size of the segregation panel to allow the two panel segments to expand to the length between two posts configured on a corner of each rack. The length that the two panel segments expand to may vary depending on spacing and depth of the space between the racks. The sliding joints may be configured as at least one slot that is positioned at a predetermined location on at least one of the two panel segments. The other of the two panel segments may include an aperture for receiving a fastener to lock the two panel segments in place once a desired length is achieved. The fastener may be a carriage or other type of bolt configured to engage the aperture and slot while receiving a nut on one end.

Further, an attachment point at a front end of the rack may be adjustable to ensure proper airflow. The panel may include one or more moveable and selectively lockable swivel joints, which may be configured to adjust the attachment points to the rack. The swivel joints create a hinge, which may allow the panel to pivot into a predetermined position. The swivel joints may be lockable through the use of a removable pin and fastener, such as, but not limited to a wing nut, lock nut, castle nut or other known locking fastener. The swivel joints may include correspondingly interlocking barrels on each panel that are configured to mesh together to create a single cylindrical aperture or sleeve that receives a pin. The pin may be configured with a stop on one end with a threaded opposing end. The threaded end may be configured to receive the fastener along with a buffer element, such as, but not limited to a rubber, plastic, or metallic bushing/washer. Other materials may be used depending on the application. The stop may be a formed head, an additional fastener, pin or other known element of preventing the rod from sliding through the interlocking barrel aperture.

Figure 2:
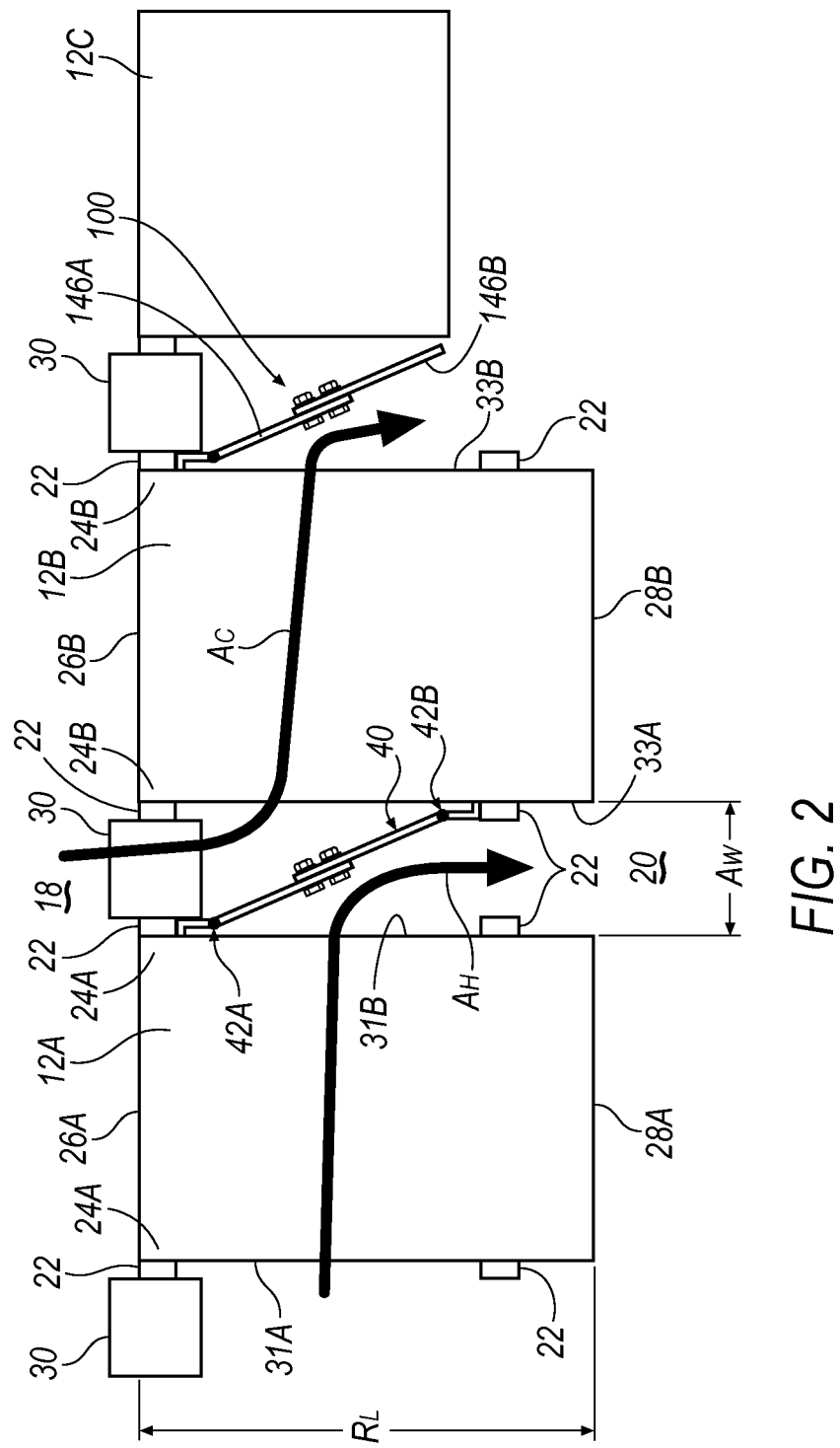
FIG. 2 illustrates a top view of the exemplary electronic equipment rack cooling system illustrated in FIG. 1 with an exemplary airflow segregation panel installed.

Referring now to FIGS. 1 and 2, an exemplary arrangement 10 of racks 12A, 12B for housing electronic equipment 14 that may be found, for example, in a data center. Racks 12A, 12B are spaced apart from one another to define an airflow delivery aisle 16 therebetween. As best seen in FIG. 2, a first side of arrangement 10 is configured as a "cold" aisle 18 and a second side of arrangement 10 is configured as a "hot" aisle 20. A cold aisle contains air at a temperature that is lower than the air in a hot aisle, as will be explained below in further detail. Rack pillars 22 may be provided to provide a frame for the racks 12A, 12B, as well as a mounting surface for supporting additional accessories. As best seen in FIG. 1, rack pillars 22 extend generally from a top surface 23A, 23B to a bottom surface 25A, 25B of racks 12A, 12B. In one exemplary arrangement, rack pillars 22 are provided adjacent the corners 24A, 24B of the first side 26A, 26B of each rack 12A, 12B. Rack pillars 22 may also be provided adjacent a second side 28A, 28B of each rack 12A, 12B, to form a four pillar system as illustrated in FIGS. 1 and 2.

Racks 12A, 12B are configured with a plurality of shelves 13 that serve to create storage shoes for receiving electronic equipment 14. To ensure proper airflow, empty shoes may be blocked with selectively removable blanking panels 15. Racks 12A, 12B may be constructed of fire resistant material, such as, for example, plenum rated material.

In one exemplary arrangement, a vented cable riser 30 may be supported between adjacent rack pillars 22. Cable riser 30 serves to organize and hold cable lines (not shown) extending from various electronic equipment 14 stored in racks 12A, 12B. Retaining bars 29 that extends across a face of the cable riser 30 may be employed to hold the cable lines. Vented cable riser 30 is configured provide openings 31 therethrough so as not to completely block airflow delivery aisle 16. More specifically, vented cable riser 30 is configured with openings 31 that serve to permit air to flow therethrough into airflow delivery aisle 16 and around the cables from cold aisle 18, as will be explained in further detail below. In one exemplary configuration vented cable risers 30 are configured as vertical cable risers 30, though it is understood that other configurations for a vented cable riser may be employed. While vented cable risers 30 are illustrated as extending above racks 12A, 12B, it is understood that other sized cable risers may be employed.

While in operation cold air is to be directed from the cold aisle to the hot aisle along the air flow delivery aisle 16 positioned between adjacent racks 10A, 10B, some of the electronic equipment 14 is actually vented transverse to the air flow delivery aisle 16, or through third 31A, 33A and fourth sides 31B, 33B (best seen in FIG. 2) or racks 12A, 12B. Due to this operational configuration, because data centers are generally configured for front to back cool to hot air flow, heat generated from electronic equipment 14 that is vented side to side, heated air may get caught within the racks, or the area surrounding the electronic equipment 14 becomes superheated, thereby leading to failure of the electronic components.

To provide adequate cooling, and to preventing superheating of electronic equipment 14, an airflow segregation panel 40 may be provided between racks 10A, 10B. Airflow segregation panel 40 will now be described in connection with FIGS. 3-7.

In one exemplary configuration, airflow segregation panel 40 may be configured with at least one hinge portion that permits selectively orientation of panel 40, to be explained below. In the configuration depicted in FIG. 4, airflow segregation panel 40 is configured with first and second hinge portions 42A, 42B. Hinge portions 42A, 42B is positioned between a mounting portion 44A, 44B and an airflow direction portion 46A, 46B such that airflow direction portion 46A, 46B is pivotable with respect to mounting portion 44A, 44B, as best illustrated by the arrows P and the dotted line in FIG. 5.

Mounting portions 44A, 44B may be shaped to have a generally L-shape. In one arrangement, mounting portions 44A, 44B are configured with a leg member 48A, 48B that mounts to hinge portion 42A, 42B. A foot member 50A, 50B is joined to leg member 48A, 48B. Foot member 50A, 50B may be fixedly connected to leg member 48A, 48B. Foot member 50A, 50B may be sized to have a length $L_1$ that generally corresponds to the width of rack pillars 22 such that foot member 50A, 50B may be mounted flush against rack pillars 22, as best seen in FIG. 2. Foot member 50A, 50B may be provided with mounting holes (not shown) that are configured to align with and mate to mounting holes in rack pillars 22. Leg member 48A is configured with a length $L_2$ that is long enough to space hinge portion 42A away from cable riser 30 to permit air flow direction portion 46A to be selectively moved.

Figure 3:
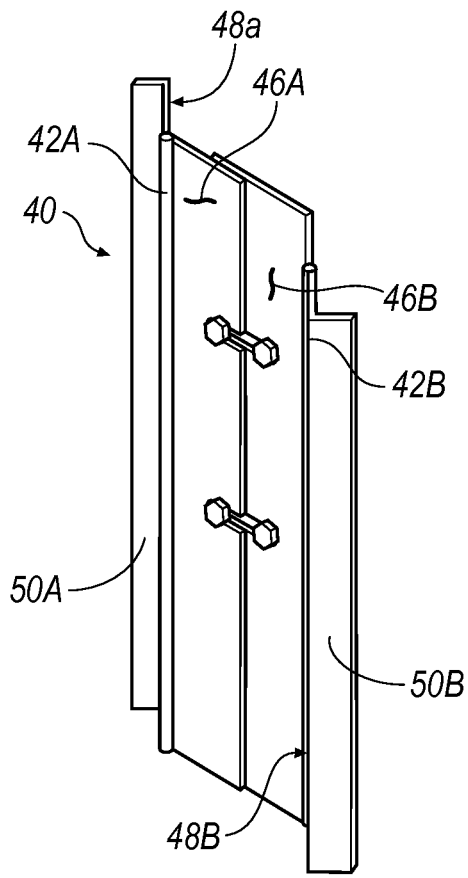
FIG. 3 illustrates an isometric view of the exemplary airflow segregation panel of FIG. 2.
Figure 4:
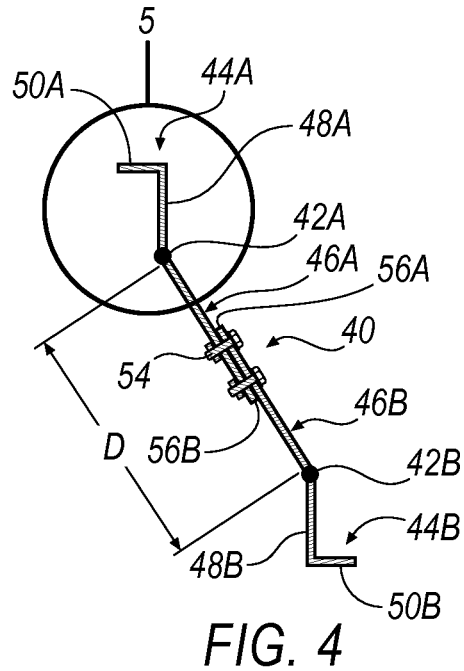
FIG. 4 illustrates a top view of the exemplary airflow segregation panel of FIGS. 2 and 3.
Figure 5:
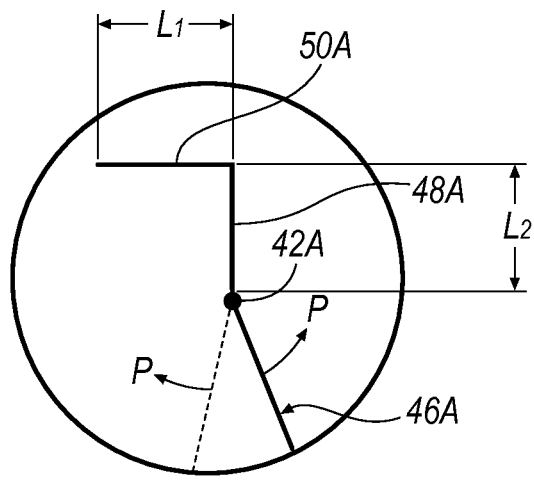
FIG. 5 illustrates a detail view of the exemplary hinge used with the airflow segregation panel illustrated in FIG. 4.

In one exemplary arrangement, for known sized racks 12A, 12B and spacing between successive racks 12A, 12B, a single air flow direction portion (not shown) may be provided between hinge portions 42A, 42B. However, to permit airflow segregation panel 40 to be used with a variety of different sized racks 12A, 12B, airflow segregation panel 40 may be configured to be selectively expandable, as illustrated in the FIGS. More specifically, air flow direction portions 46A, 46B are arranged in an overlapping manner, as best seen in FIGS. 3 and 4. In one exemplary arrangement, each air flow direction portion 46A, 46B is provided with at least one adjustment slot 52 that is configured to receive one or more connecting elements 54 (best seen in FIG. 4), such as, for example, barrelpins. Connecting elements 54 hold each air flow direction portion 46A, 46B together. However, slots 52 allow edges 56A, 56B of each air flow direction portion 46A, 46B to be selectively moved in one direction to elongate the depth D of air flow segregation panel 40, as well as permit selective movement in a second direction to shorten the depth D of air flow segregation panel 40. To secure air flow direction portions 46A, 46B to a specific depth D, a securing mechanism 58 may be utilized with connecting element 54. Non-limiting examples of such securing mechanisms 58 include, but are not limited to, wingnuts, bolts and washer arrangements.

It is understood that a variety of configurations may be utilized to form hinge portions 42A, 42B. One non-limiting exemplary configuration is illustrated in FIG. 7. In this arrangement, one edge of leg member 48A is provided with spaced sleeve portions 59 and one edge of air flow direction portion 46a is provided with spaced apart sleeve portions 60. Sleeve portions 59 and 60 are configured be fitted together in an interlocking manner to form a channel 62 between adjacent leg member 48A and air flow direction portion 46A. A rod or bolt member 64 is received therewithin (as best seen in FIG. 8). A bolt head 66 may hold one end of bolt member 64 with channel 62. An opposite end of bolt member 64 may be threaded and receive a suitable connecting element 68, such as, for example, a wing nut. Washers 70 may be positioned between bolt head 66 and connecting element, respectively, and the openings to channel 62.

Operation of air flow segregation panel 40 will now be explained with reference to FIG. 2. For racks 12A, 12B that include side to side venting equipment, to direct cool air from cold aisle 18 to flow transversely through racks 12A, 12B, air flow segregation panel 40 may be oriented such that heated air is exhausted toward hot aisle 20. In this configuration, foot members 50A, 50B are secured to rack pillars 22 such that one foot member 50a is secured to a rack pillar 22 mounted on rack 12A and the other foot member 50b is secured to a rack pillar 22 of an adjacent rack 12B. In this arrangement, air flow segregation panel 40 is oriented at an angle in air flow delivery aisle 16, when viewed from the top. Hinge portions 42A, 42B permit the orientation of air flow segregation panel 40 to be varied. As the length $R_L$ of racks 12A, 12B may vary, as well as the width $A_W$ of air flow delivery aisle 16, air flow segregation panel 40 is selectively adjustable to expand (or contract) the depth D of air flow segregation panel 40. Thus, to secure each foot member connecting member 54 are able so slide within slots 52 to move overlapping air flow direction portions 46A, 46B with respect to one another. Once air flow segregation panel 40 is positioned, securing members 58 fix the overlapping air flow direction portions 46A, 46B together.

In this configuration, cooling air (represented by arrow $A_C$) is directed through vented cable risers 30 into air flow delivery aisle 16. Because air flow segregation panel 40 is positioned at an angle within air flow delivery aisle 16, cold air $A_C$ is directed to enter rack 12B through third side 33A and pass through rack 12B to exhaust from fourth side 33B. The cooling air will become heated at this point. Air flow segregation panel 40 also serves to make sure that exhausted heated air will be directed to the hot aisle 20. More specifically, as best seen in FIG. 2, as air passes through rack 12A, and is exhausted into air flow delivery aisle 16, air flow segregation panel 40 prevents heated air $A_H$ from entering into adjacent rack 12B, and instead directs heated air $A_H$ to hot aisle 16.

An alternative arrangement of an air flow segregation panel 100 is shown in FIG. 2. Air flow segregation panel 100 may be used when adjacent racks 12B, 12C have different lengths or when a rack 12C does not have a rack pillar 22. Air flow segregation panel 100 is similar to air flow segregation panel 40 in that it includes air flow direction portions 146A, 146B connected together in an overlapping manner and configured for selectively expansion as described above. However, air flow direction portion 146 does not contain a hinge portion connected to thereto. Hinge portion 142A permits air flow direction portions 146A, 146B to be oriented so as to direct cool air entering through vented cable riser 30 transversely through rack 12C.

Reference in the specification to "one example," "an example," "one arrangement," or "a configuration" means that a particular feature, structure, or characteristic described in connection with the example is included in at least one example. The appearances of the phrase "in one example" in various places in the specification does not necessarily refer to the same example each time it appears.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps could be performed simultaneously, that other steps could be added, or that certain steps described herein could be omitted. In other words, the descriptions of processes herein are provided for the purpose of illustrating certain alternative arrangements, and should in no way be construed so as to limit the claimed invention.

Accordingly, it is to be understood that the above description is intended to be illustrative and not restrictive. Many arrangements and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future arrangements. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A storage rack cooling arrangement, comprising:
   a first storage rack and a second storage rack each configured to store at least one electronic component, the first storage rack and the second storage rack each defined by opposing first and second sides and opposing third and fourth sides, the first sides of the first and second storage racks being substantially perpendicular to the third sides of the first and second storage racks, the first side of the first storage rack facing a same direction as the first side of the second storage rack, the third side of the first rack facing a same direction as the third side of the second storage rack, wherein a first airflow pathway is formed through the third and fourth sides of the first storage rack, and a second airflow pathway is formed through the third and fourth sides of the second storage rack, the first storage rack and the second storage rack being positioned adjacent each other such that an airflow delivery aisle is positioned therebetween;
   a selectively positionable airflow segregation panel having a first connection end that is configured to be selectively positioned adjacent the first side of the first storage rack so as to direct air flow from the first airflow pathway in a direction toward the second side of the first storage rack, and to direct air flow from the second airflow pathway in a direction from the first side of the second storage rack;
   at least one first rack pillar mounted on the first storage rack, one of the at least one first rack pillar being adjacent to the first side of the first storage rack and extending from the fourth side of the first storage rack into the airflow delivery aisle, and at least one second rack pillar mounted on the second storage rack, one of the at least one second rack pillar being adjacent to the first side of the second storage rack and extending from the third side of the second storage rack into the airflow delivery aisle, the first connection end of the airflow segregation panel being selectively secured to the one of the at least one first rack pillar of the first storage rack; and
   a vented cable riser positioned in the airflow delivery aisle and supported on the one of the at least one first rack pillar of the first storage rack and the one of the at least one second rack pillar of the second storage rack.

2. The storage rack cooling arrangement of claim 1, wherein the airflow segregation panel is positioned within the airflow delivery aisle so as to be oriented at an angle with respect to the first storage rack and the second storage rack to direct cooling air through a first portion of the airflow delivery aisle and into the second storage rack and to direct heated air leaving the first storage rack into a second portion of the air flow delivery aisle to exit the airflow delivery aisle at the second side of the first storage rack.

3. The storage rack cooling arrangement of claim 1, wherein the airflow segregation panel further comprises an air flow direction portion and a hinge positioned between the first connection end and the air flow direction portion such that the air flow direction portion is selectively pivotable with respect to the first connection end.

4. The storage rack cooling arrangement of claim 3, wherein the hinge is formed by a first set of spaced apart sleeves arranged on one end of the connection end and a second set of spaced apart sleeves arranged on one end of the air flow direction portion, wherein the first and second set of spaced apart sleeves are arranged in an interlocking manner to form a channel that receives a rod.

5. The storage rack cooling arrangement of claim 4, further comprising a connection member that may be selectively tightened to fix the first connection end with respect to the air flow direction portion.

6. The storage rack cooling arrangement of claim 1, wherein the airflow segregation panel further comprises an air flow direction portion, a second connection end and first and second hinge portions, wherein the first hinge portion is positioned between the first connection end and the air flow direction portion and the second hinge portion is positioned between the second connection end and the air flow direction portion.

7. The storage rack cooling arrangement of claim 6, wherein the air flow direction portion further comprises a first airflow direction portion and a second airflow direction portion operatively connected together in an overlapping manner such that a length of the air flow direction portion may be selectively expanded and contracted.

8. The storage rack cooling arrangement of claim 7, wherein the first and second airflow direction portions each include at least one slot formed therein, wherein the slots of each of the first and second airflow direction portions are aligned in one direction and configured to receive a connecting element to attach the first and second airflow direction portions operatively together.

9. The storage rack cooling arrangement of claim 8, wherein the connecting element may be selectively tightened to restrict movement of the first airflow direction portion relative to the second airflow direction portion to fix the length of the airflow direction portion.

10. The storage rack cooling arrangement of claim 1, wherein the first connection end comprises a leg portion that is fixedly connected to a foot portion and wherein the foot portion is disposed at an angle with respect to the leg portion.

11. The storage rack cooling arrangement of claim 10, wherein the foot portion is attached to the at least one first rack pillar, the foot portion having a length that is equal to a width of the at least one first rack pillar.

12. A storage rack cooling arrangement, comprising:
a first storage rack and a second storage rack each configured to store at least one electronic component, the first storage rack and the second storage rack each defined by opposing first and second sides and opposing third and fourth sides, the first sides of the first and second storage racks being substantially perpendicular to the third sides of the first and second storage racks, the first side of the first storage rack facing a same direction as the first side of the second storage rack, the third side of the first rack facing a same direction as the third side of the second storage rack, wherein an airflow pathway is formed through the third and fourth sides of the first storage rack, the first storage rack and the second storage rack being positioned adjacent each other such that an airflow delivery aisle is positioned therebetween;
at least one first rack pillar mounted on the first storage rack, one of the at least one first rack pillar being adjacent to the first side of the first storage rack and extending from the fourth side of the first storage rack into the airflow delivery aisle, and at least one second rack pillar mounted on the second storage rack, one of the at least one second rack pillar being adjacent to the second side of the second storage rack and extending from the third side of the second storage rack into the airflow delivery aisle; and
a selectively positionable airflow segregation panel having a first connection end that is configured to be selectively secured to the one of the at least one first rack pillar of the first storage rack, and a second connection end that is configured to be selectively secured to the one of the at least one second rack pillar of the second storage rack, the first connection end and the second connection end each comprising a leg portion that is fixedly connected to a foot portion, wherein the foot portion is disposed at an angle with respect to the leg portion.

13. A storage rack cooling arrangement, comprising:
a first storage rack configured to store at least one electronic component, the first storage rack being defined by opposing first and second sides and opposing third and fourth sides, the first side being substantially perpendicular to the third side, wherein an airflow pathway is formed through the third and fourth sides;
a selectively positionable airflow segregation panel having a first connection end that is configured to be selectively positioned adjacent the first side of the first storage rack so as to direct air flow from the airflow pathway in a direction toward the second side of the first storage rack; an
at least two rack pillars each mounted on the first storage rack, one of the at least two rack pillars extending from one of the third side or the fourth side of the first storage rack, and another of the at least two rack pillars extending from another of the third side or the fourth side of the first storage rack, each of the at least two rack pillars being off-center with respect to a longitudinal direction of the first storage rack from the first side to the second side;
wherein the first connection end of the selectively positionable airflow segregation panel is configured to be selectively secured to the one of the at least two rack pillars adjacent the first side of the first storage rack,
wherein the another of the at least two rack pillars is configured to selectively secure a second connection end of another selectively positionable airflow segregation panel, and
wherein at least one of a length of the selectively positionable airflow segregation panel or an angle of the selectively positionable airflow segregation panel with respect to the longitudinal direction is adjustable to enable the selective positioning of the airflow segregation panel.

* * * * *